US007189980B2

(12) United States Patent
Mollica

(10) Patent No.: US 7,189,980 B2
(45) Date of Patent: Mar. 13, 2007

(54) METHODS AND SYSTEMS FOR OPTIMIZING ION IMPLANTATION UNIFORMITY CONTROL

(75) Inventor: Rosario Mollica, Wilmington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 73 days.

(21) Appl. No.: 10/740,654

(22) Filed: Dec. 18, 2003

(65) Prior Publication Data
US 2004/0256573 A1 Dec. 23, 2004

Related U.S. Application Data

(60) Provisional application No. 60/469,371, filed on May 9, 2003.

(51) Int. Cl.
H01J 37/317 (2006.01)
H01J 37/304 (2006.01)

(52) U.S. Cl. .............. 250/492.21; 250/492.1; 250/492.2; 250/492.3; 250/397; 250/396 R

(58) Field of Classification Search ........... 250/492.21
See application file for complete search history.

(56) References Cited

U.S. PATENT DOCUMENTS

| 5,375,451 | A  | * | 12/1994 | Sandstrom ................... 73/7 |
| 5,834,787 | A  | * | 11/1998 | Bunker .................. 250/492.21 |
| 6,297,510 | B1 | * | 10/2001 | Farley ................... 250/492.21 |
| 6,313,474 | B1 | * | 11/2001 | Iwasawa et al. ......... 250/492.21 |
| 6,323,497 | B1 | * | 11/2001 | Walther ................. 250/492.21 |
| 6,433,553 | B1 | * | 8/2002  | Goeckner et al. ............ 324/464 |
| 6,525,327 | B1 | * | 2/2003  | Mitchell et al. ........ 250/492.21 |
| 6,580,083 | B2 | * | 6/2003  | Berrian .................. 250/492.21 |
| 6,608,316 | B1 | * | 8/2003  | Harrison ................. 250/492.21 |
| 6,661,016 | B2 | * | 12/2003 | Berrian .................. 250/492.21 |
| 6,690,022 | B2 | * | 2/2004  | Larsen et al. .......... 250/492.21 |
| 2002/0081788 | A1 | * | 6/2002 | Cucchetti et al. ........... 438/200 |
| 2002/0134948 | A1 | * | 9/2002 | Olson et al. ........... 250/492.21 |

FOREIGN PATENT DOCUMENTS

JP  06-017847  * 1/1985
JP  01-163953  * 6/1989

* cited by examiner

Primary Examiner—Nikita Wells
(74) Attorney, Agent, or Firm—Varian Semiconductor Equipment Associates, Inc.

(57) ABSTRACT

An apparatus and method are provided for optimizing ion implantation uniformity in a workpiece, such as a semiconductor wafer, which includes an ion beam generator for generating an ion beam, a beam scanning mechanism for diverging the ion beam and generating substantially parallel ion beam trajectories towards the workpiece, and an ion beam detector for measuring the ion beam current of the parallel ion beam trajectories as a function of the position of the ion beam detector. A uniformity controller filters the ion beam current measured by the ion beam detector to at least one predetermined resolution range and generates a uniformity signal to the beam scanning mechanism in response to the filtered ion beam current so that the workpiece is uniformly implanted. The uniformity controller determines a controllable frequency range for optimizing ion implantation uniformity control by making controllable frequencies observable and uncontrollable frequencies unobservable. As a result, the uniformity controller observes and controls spacially distributed components of the profiled beam current for optimizing the implantation of doses to the workpiece in a time and cost efficient manner.

17 Claims, 7 Drawing Sheets

METHODS AND SYSTEMS FOR OPTIMIZING ION IMPLANTATION UNIFORMITY CONTROL

This application claims priority to U.S. Ser. No. 60/469,371, entitled "Methods and Systems for Optimizing Ion Implantation Uniformity Control," filed on May 9, 2003, naming Rosario Mollica as the inventor, the contents of which are herein incorporated by reference in their entirety.

BACKGROUND (1) Field

The disclosed methods and systems relate generally to optimizing ion implantation uniformity control.

(2) Description of Relevant Art

Ion implantation is a technique for introducing impurities into semiconductor materials to alter the electrical properties of these materials. The impurity material is ionized in an ion source and accelerated to form an ion beam of prescribed energy. The ion beam is then directed at the surface of a semiconductor material such as a silicon wafer. The ions penetrate the wafer and become imbedded into the crystalline lattice of the wafer to form a region of desired conductivity.

Ion implantation systems usually include an ion source for converting a gas or solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined, at least in part, by the energy of the ions implanted into the semiconductor wafer. Shallow junctions are obtained with low implant energies. Ion implanters are typically designed for efficient operation at relatively high implant energies, for example in the range of 50 keV to 400 keV, and may not function efficiently at the energies required for shallow junction implantation. At low implant energies, the current delivered to the wafer is much lower than desired and in some cases may be near zero. As a result, extremely long implant times are required to achieve a specified dose, and throughput is adversely affected. Such reduction in throughput increases fabrication cost and is unacceptable to semiconductor device manufacturers. Therefore, an ion implantation system is desired for optimizing the implantation of doses into semiconductor wafers.

SUMMARY OF THE INVENTION

According to an aspect of the invention, an apparatus for optimizing, ion implantation uniformity in a workpiece, such as a semiconductor wafer, comprises an ion beam generator for generating an ion beam, a beam scanning mechanism for diverging the ion beam and generating substantially parallel ion beam trajectories towards the workpiece, and an ion beam detector for measuring the ion beam current of the parallel ion beam trajectories as a function of the position of the ion beam detector. A uniformity controller filters the ion beam current measured by the ion beam detector to at least one predetermined resolution range and generates a uniformity signal to the beam scanning mechanism in response to the filtered ion beam current so that the workpiece is uniformly implanted. The uniformity controller determines a controllable frequency range for optimizing ion implantation uniformity control by making controllable frequencies observable and uncontrollable frequencies unobservable. As a result, the uniformity controller observes and controls spacially distributed components of the profiled beam current for optimizing the implantation of doses to the workpiece in a time and cost efficient manner.

More particularly, the apparatus may include a low pass filter, a high pass filter, a band pass filter or a combination of filters for filtering the measured ion beam current into one or more predetermined resolution ranges. Thereby, uncontrollable feedback signal components may be filtered out from the measured ion beam current and controllable feedback signal components pass through. The apparatus may further include a processor for iteratively measuring and processing the beam current until the desired uniformity range is obtained.

In another embodiment of the present invention, a method is provided for optimizing ion implantation uniformity in a workpiece, such as a semiconductor wafer. The method comprises the steps of generating an ion beam, diverging and focusing the ion beam to generate substantially parallel ion beam trajectories towards the workpiece, measuring the ion beam current as a function of the detector used for detecting the ion beam. The measured ion beam is then filtered to one or more predetermined resolution ranges within a correctable system spectrum and a uniformity signal is generated and inputted to a beam scanning mechanism in response to the filtered ion beam current so that the workpiece is uniformly implanted. As a result, the spacially distributed components of the profiled beam current are observed and controlled for optimizing the implantation of doses to the workpiece in a time and cost efficient manner.

BRIEF DESCRIPTION OF THE DRAWINGS

Other advantages, features and embodiments will be apparent from the following detailed description when considered in conjunction with the accompanying figures.

DESCRIPTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Figure 1A:
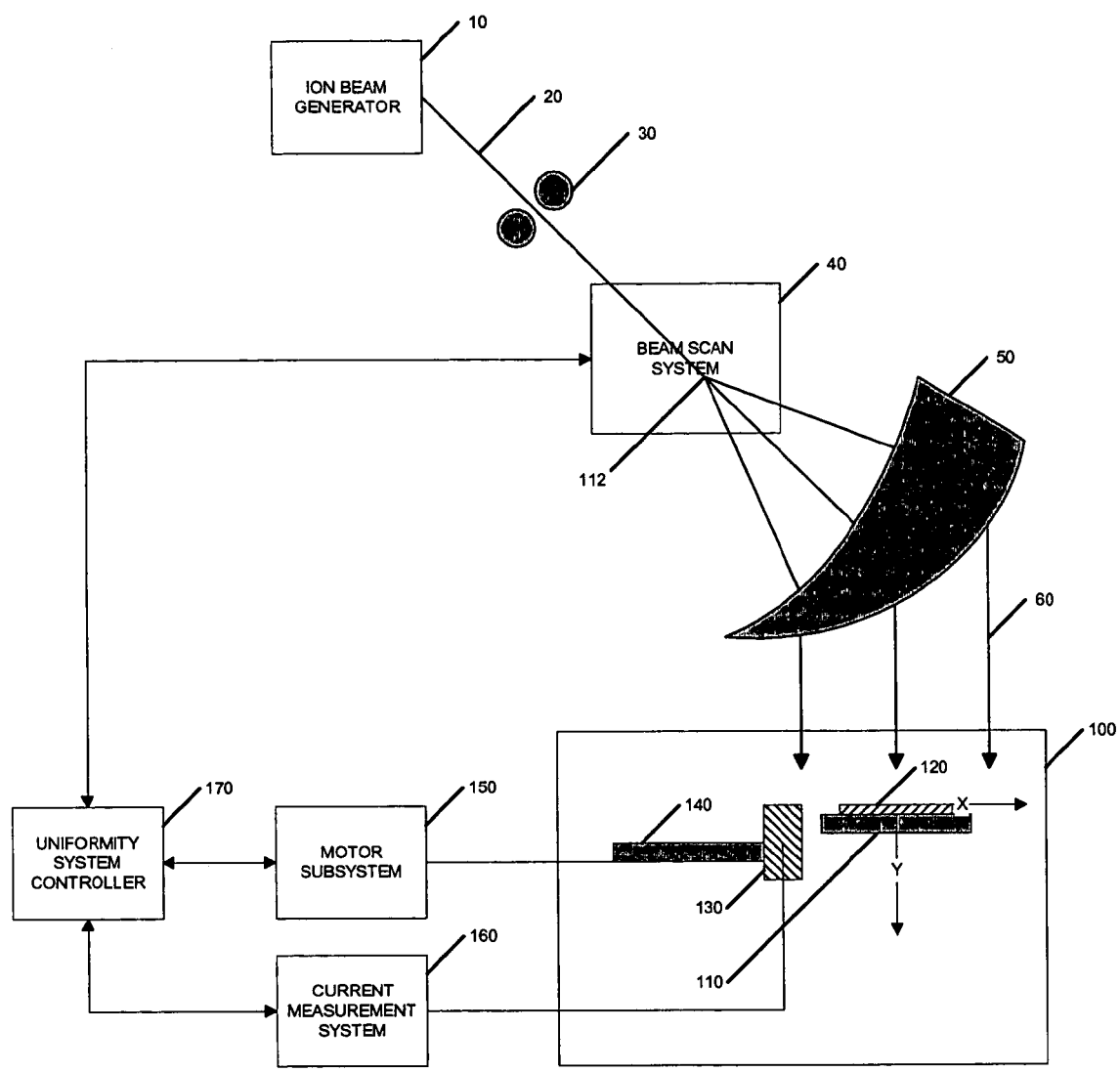
FIGS. 1a and 1b illustrate wafer uniformity optimization control systems according to embodiments of the present invention.
Figure 1B:
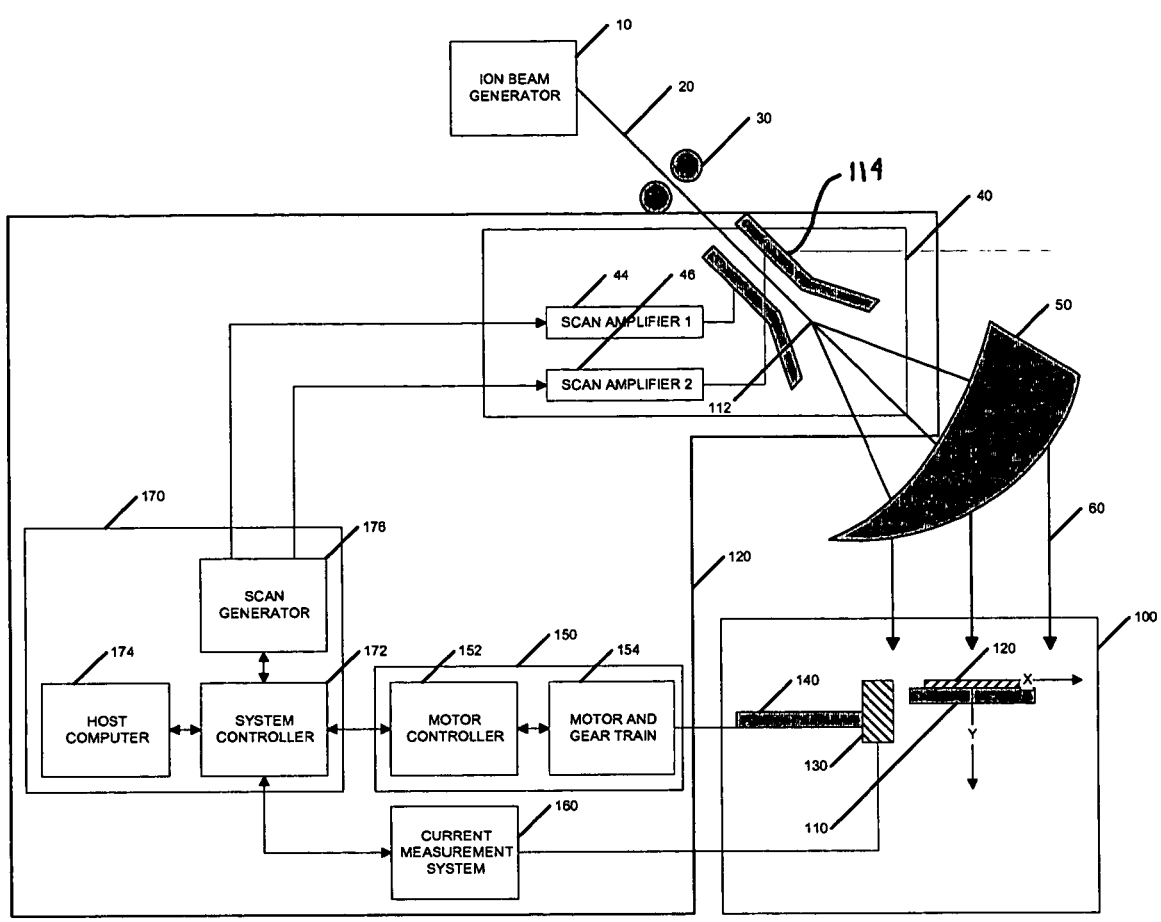

Simplified block diagrams of examples of ion implanters incorporating the present invention are shown in FIGS. 1a and 1b. An ion beam generator 10 generates an ion beam 20 of desired species, accelerates the ions in the beam to desired energies, performs mass/energy analysis of the ion beam to remove energy and mass contaminants and supplies an energetic ion beam having a low level of energy and mass contaminants. The ion beam 20 travels through a mass resolving aperture 30 to further remove undesirable ion energies and species before passing through scan plates 114 of the beam scan system 40. Details of the conventional components used in the system of the present invention are described in more detail in U.S. Pat. Nos. 6,075,249 and 6,437,350.

The scan plates 114 are used to produce ion trajectories that diverge from a point 112. The scanned beam then travels through an ion optical element referred to as an angle corrector 50 that focuses the beam. The scanned beam has parallel or nearly parallel ion trajectories 60 output from the angle corrector 50. Downstream of the angle corrector is the end station 100. Within the end station 100, is the wafer platen 110 supporting a wafer 120 in the path of the scanned ion beam 60 such that ions of a desired species are implanted into the semiconductor wafer 120. The end station 100 also includes instrumentation for measuring the ion beam current in the approximate y-plane location where the wafer 120 is positioned during implantation. For example, this instrumentation may include a profiling Faraday detector 130 supported on a mounting shaft 140. The Faraday detector 130 can be moved using a motorized system 150 to determine the scanned beam current as a function of position. This simultaneous measurement of beam current as a function of position is often referred to as profiling and the data produced is a beam current profile. A beam current profile measured by a current measurement system 160 in this way may be performed prior to wafer implantation to insure that ion dose measured in ions per square centimeter is uniformly applied to the wafer.

A uniformity optimization controller 170 comprised of several components is used to produce a uniform implant dose. The uniformity optimization controller 170 may include a system controller 172 for coordinating the scanning of the ion beam and the measurement of ion beam current. The system controller 172 may be microprocessor based and designed to generate a voltage waveform that will produce a beam current profile that is uniform to within a given specification. Low voltage signals are generated by the system scan generator and applied to the scan plates by a scan generator 176 and amplifiers 44 and 46 that magnify the waveforms. The specification on uniformity is given in terms of the standard deviation of the measured beam current as a percentage of the average, or mean, beam current.

Figure 2A:
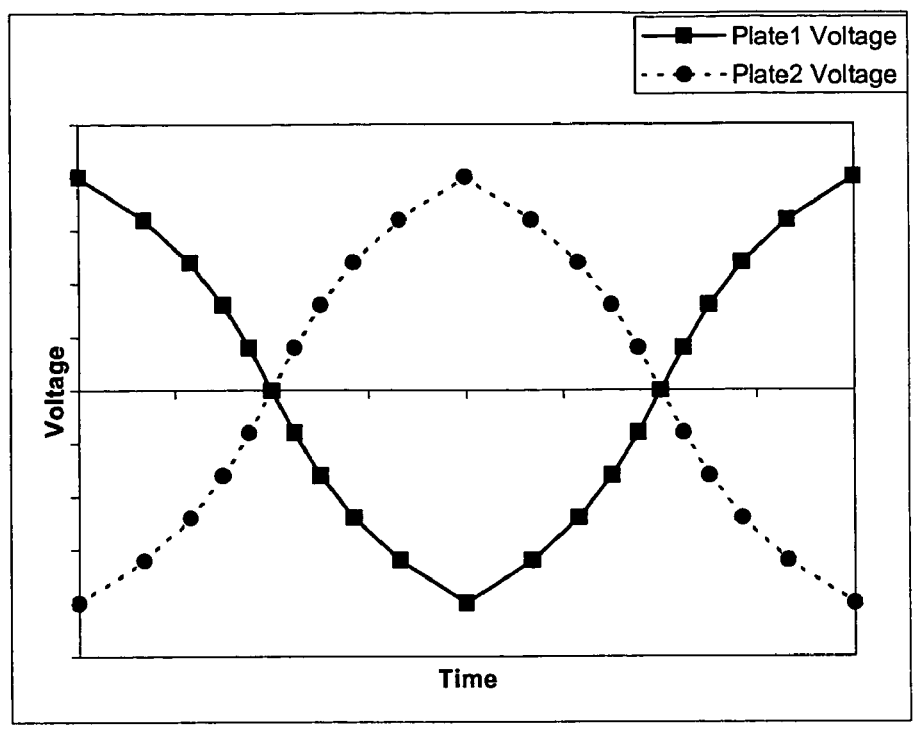
FIGS. 2a and 2b respectively illustrate voltage vs. time and voltage vs. beam position characteristics for the scan plates according to embodiments of the present invention.

The scan amplifiers receive phased AC scan voltages from the scan generator similar to those in FIG. 2a. The amplitude of the AC scan waveform depends on the size of the beam when it is not scanning (i.e.: spot mode), the ion species and energy, the location of beam current detectors, and the wafer dimensions. Additionally, a DC voltage offset can also be applied to both scan plates to focus the ion beam. The applied scan voltage waveforms in this example result in the ion beam being scanned from the side closest to one scan plate to the side closest to the other scan plate and back again. The profiling faraday, current measurement system electronics, and motor system are used to measure the scanned beam uniformity as a function of x-position. This measurement procedure is often referred to as profiling the beam current. The resulting signature of beam current as a function of position is referred to as the uniformity profile.

Figure 2B:
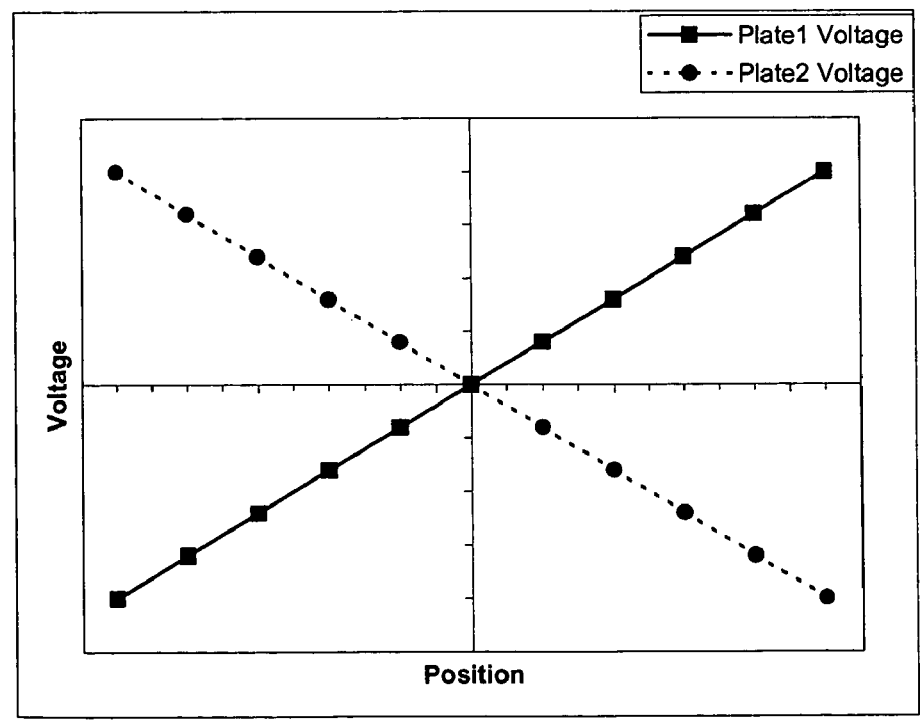

The uniformity is not generally within specifications for a constant scan voltage rate (i.e.: saw-tooth) waveform due to disturbances in the beam shape while scanning, etc. The desired specification on uniformity is achieved by modifying the nearly saw-tooth waveform to adjust the uniformity of the ion dose applied to the wafer. The deflection of the beam is proportional to the difference in the applied voltage to the scan plates as shown in FIG. 2b. The waveform adjustment procedure involves changing the rate at which the beam is scanned at discrete locations along the x-direction to compensate for the non-uniformities in the profile measurement. Reducing the beam scan rate in a region will apply more ion dose. Conversely, increasing the scan rate will apply less ion dose in a region.

Figure 3:
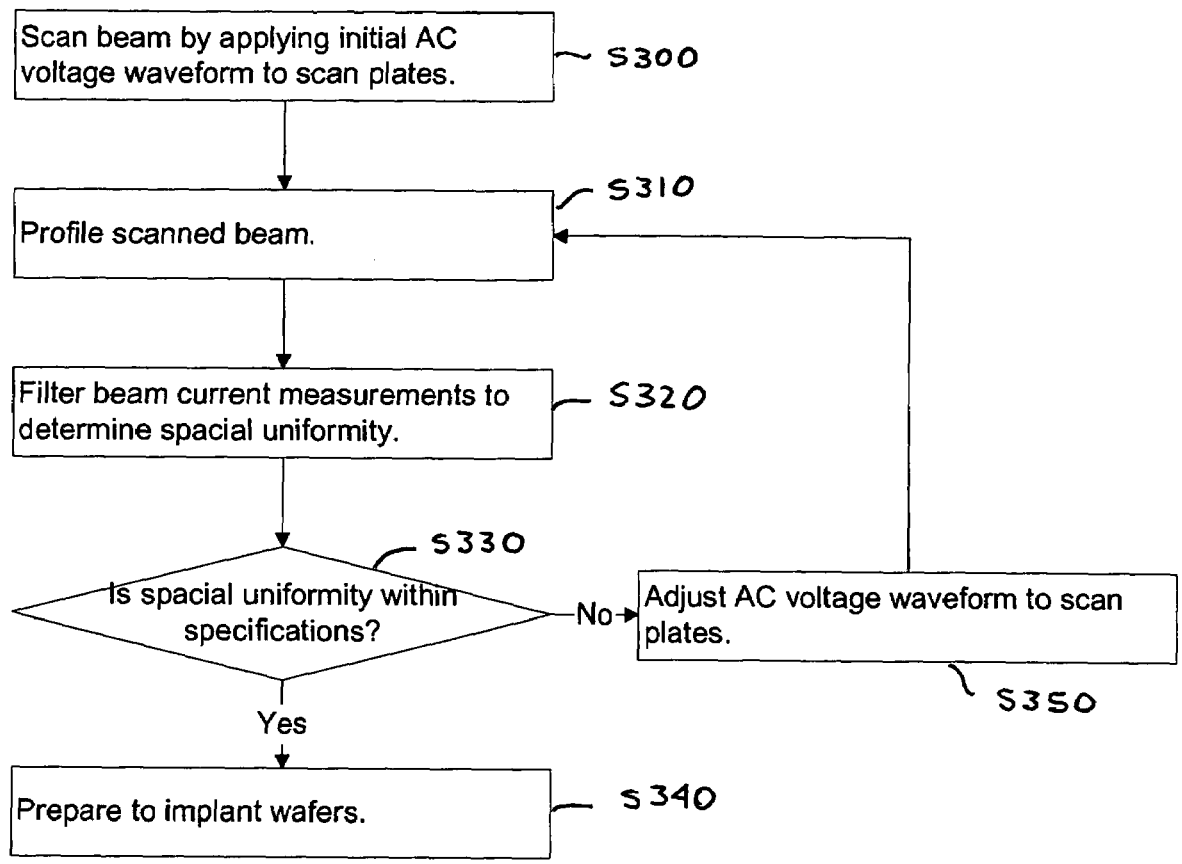
FIG. 3 is a flow chart for a uniformity optimization process according to an embodiment of the present invention.

A uniformity optimization procedure according to one embodiment of the present invention is illustrated in FIG. 3. In this embodiment, a scan beam is generated by applying an initial AC voltage waveform to the scan plates at step S300. Next, the scanned beam is profiled at step S310. The spacial uniformity is determined by filtering the beam current measurements at step S320. The spacial uniformity is compared with a predetermined specification range at step S330. If the spacial uniformity is determined to be outside of the predetermined specification range at step S330, the AC voltage waveform applied to the scan plates is adjusted at step S350. If the spacial uniformity is determined to be within the predetermined specification range at step S330, the wafers may be prepared and positioned for implantation at step S340.

Figure 4:
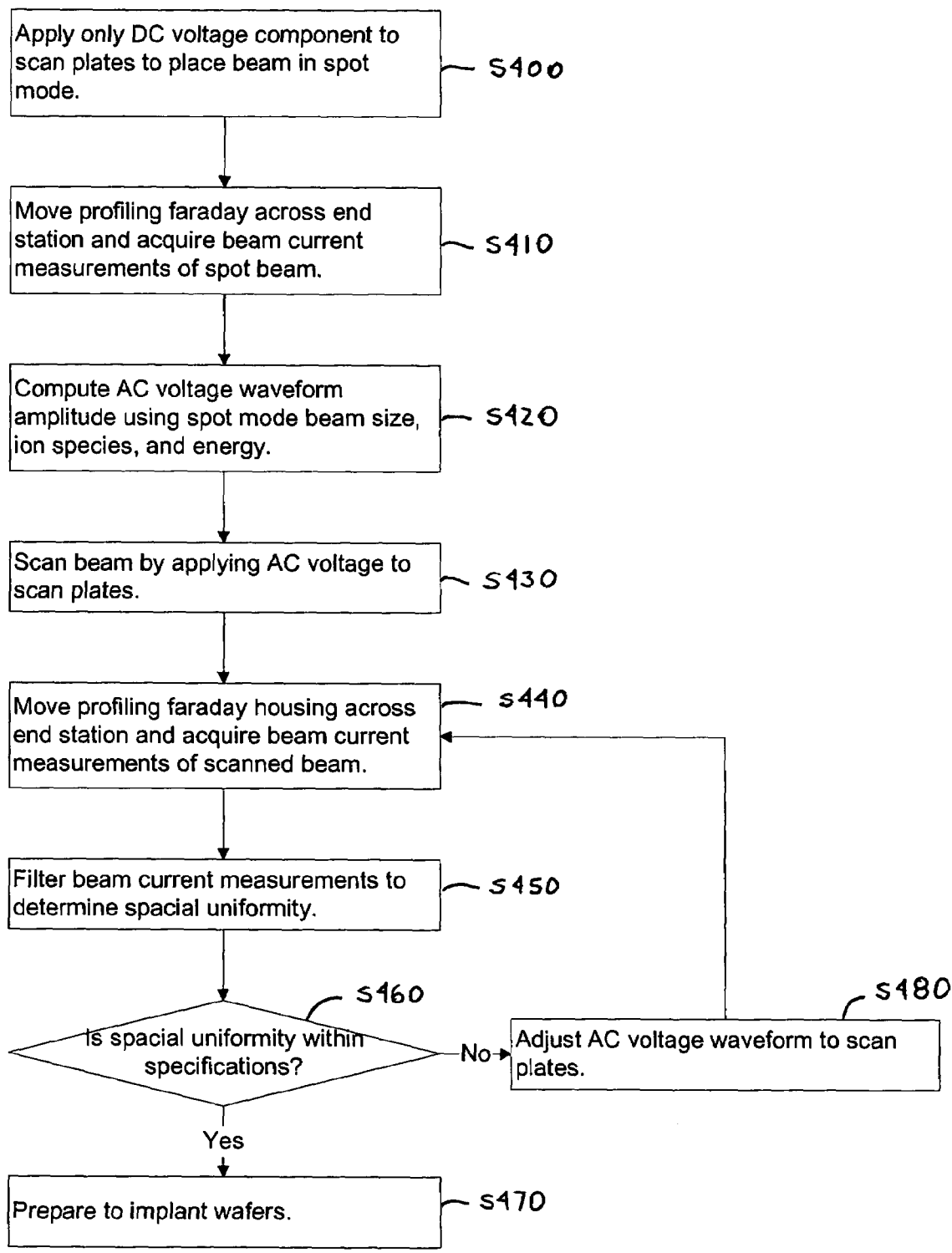
FIG. 4 is a flow chart for a uniformity optimization process according to another embodiment of the present invention.

In another embodiment of the uniformity optimization procedure according to the present invention as illustrated in FIG. 4, the beam is placed in a spot mode by applying only DC voltage components to the scan plates at step S400. Next, the profiling Faraday is moved across the end station and beam current measurements of the spot beam are acquired at step S410. At step S420, the AC voltage waveform amplitude is computed using the spot mode beam size, ion species and energy and then the beam is scanned at step S430 by applying AC voltages to the scan plates. At step S440, the profiling Faraday is moved across the end station and the beam current measurements of the scanned beam are acquired and then the spacial uniformity is determined at step S450 by filtering the beam current measurements. At step S460, the spacial uniformity is compared to a predetermined specification range. If the spacial uniformity is determined to be outside of the predetermined specification range at step S460, the AC voltage waveform applied to the scan plates is adjusted at step S480. If the spacial uniformity is determined to be within the predetermined specification range at step S460, the wafers can be prepared and positioned for implantation at step S470.

A finite number of scan waveform correction points is determined a priori and positioned at equal intervals in the direction that the beam is scanning (i.e.: x-direction) by the uniformity system controller. As a result, the maximum amount of beam non-uniformities for which the system can compensate is finite. In terms of control theory, the maximum controllable frequency in the uniformity profile is finite. The amount of correction points is selected sufficiently large to be able to compensate adequately for the spatially distributed non-uniformities encountered in this type of ion implanter system.

Additionally, there are sources of noise in the system that result in time dependent components in the measured signals. Noise sources include the power supplies of the components within the ion beam generator, the rotating drums comprising the mass resolving aperture, etc. These noise components mask the spatially distributed non-uniformities in beam current resulting from the scanned beam. In terms of control theory, the frequencies of the noise components are observable in the uniformity profile. The noise components are not controllable because by definition they are time dependent and not spacially dependent.

According to one embodiment of the present invention, a digital band-pass filter design methodology is provided to optimize ion implanter uniformity control in a given direction by making (1) controllable frequencies observable and (2) uncontrollable frequencies unobservable. The design methodology uses the uniformity system's control parameters to define the controllable beam current signal frequencies and set the filter pass band frequency range(s). The known noise sources, which are not spacially distributed, define the attenuated frequency range(s). As a result, the uniformity optimization control system observes and controls the spatially distributed components of uniformity profile. The beam noise components will not significantly impact the wafer ion dose uniformity if the wafer surface is implanted over a time period sufficiently long to allow negation of the beam noise components.

The controllable frequency range was determined from the control system parameters. The beam current measurements are taken at a constant interval, S, along the x-direction while the profiling faraday is moved at a constant velocity, v. Therefore, the uniformity profile is effectively a signal sampled at a constant time interval. The sampling frequency, $f_s$, is shown in Eqn. 1. An example of a sampling frequency for a system is 32 Hz.

$$f_s = v/S \qquad \text{Eqn. 1}$$

The observed frequency of a static sinusoidal signal in space with respect to an observer moving at constant velocity, v, is shown in Eqn. 2 in terms of the signal wavelength, $\lambda$.

$$f = v/\lambda \qquad \text{Eqn. 2}$$

The maximum controllable frequency can be estimated from the fundamental frequency produced by scan voltage waveforms where the scan rate alternates between two constant rates at each correction point. The maximum controllable frequency, $f_c$, is shown in Eqn. 3 for correction points at equal intervals, P, along the profile direction. In this case, the wavelength in Eqn. 2 is two times the correction point spacing. This spacing defines the spacial resolution of the uniformity optimization system.

$$f_c = v/(2P) \qquad \text{Eqn. 3}$$

The maximum controllable frequency can alternatively be expressed in terms of the sampling rate of system by solving Eqn. 1 for the profiler velocity, v, and substituting the result into Eqn. 3. The result is shown as Eqn. 4 below. For an example design, the spatial resolution, sampling rate, and sampling interval are such that the maximum controllable frequency from Eqn. 4 is approximately 1.6 Hz. The sampling interval and spatial resolution selected are such that S<<P.

$$f_c = (f_s S)/(2P) \qquad \text{Eqn. 4}$$

The frequencies of the known noise sources define the stop band where the components are attenuated. The lowest known frequency noise source in this example system results from the drum rotation of the mass resolving aperture. This frequency may be approximately 3.7 Hz.

The filter design type selected in one embodiment was a low pass filter because the maximum controllable frequency occurs at a lower frequency than the minimum observable noise frequency component. Consequently, attenuating all frequencies above the maximum controllable frequency would accomplish the design intent. A low pass filter combined with a notch filter design could have been used had the frequency ranges overlapped. This would potentially have allowed undesirable attenuation in the controllable frequency range.

The selected filter design is implemented through software processing of the uniformity profile signal on the host computer in FIG. 1 according to one embodiment of the present invention. In another embodiment of the present invention, hardware components may be utilized to achieve similar effects. The specific design algorithm is based on a conventional finite-impulse response (FIR) design. In the specific implementation used, an odd number of coefficients are selected and positioned symmetrically around each beam current sample to be filtered according to an embodiment of the present invention. A symmetric arrangement produces no signal phase loss over the frequency spectrum. This implementation is shown in Eqn. 5 where Ck are the filter coefficients and X(n) are the beam current samples.

$$S(i) = C0X(i-7) + C1X(i-6) + \ldots + C7X(i) + \ldots + C13X(i+6) + C14X(i+7) \qquad \text{Eqn. 5}$$

Figure 5:
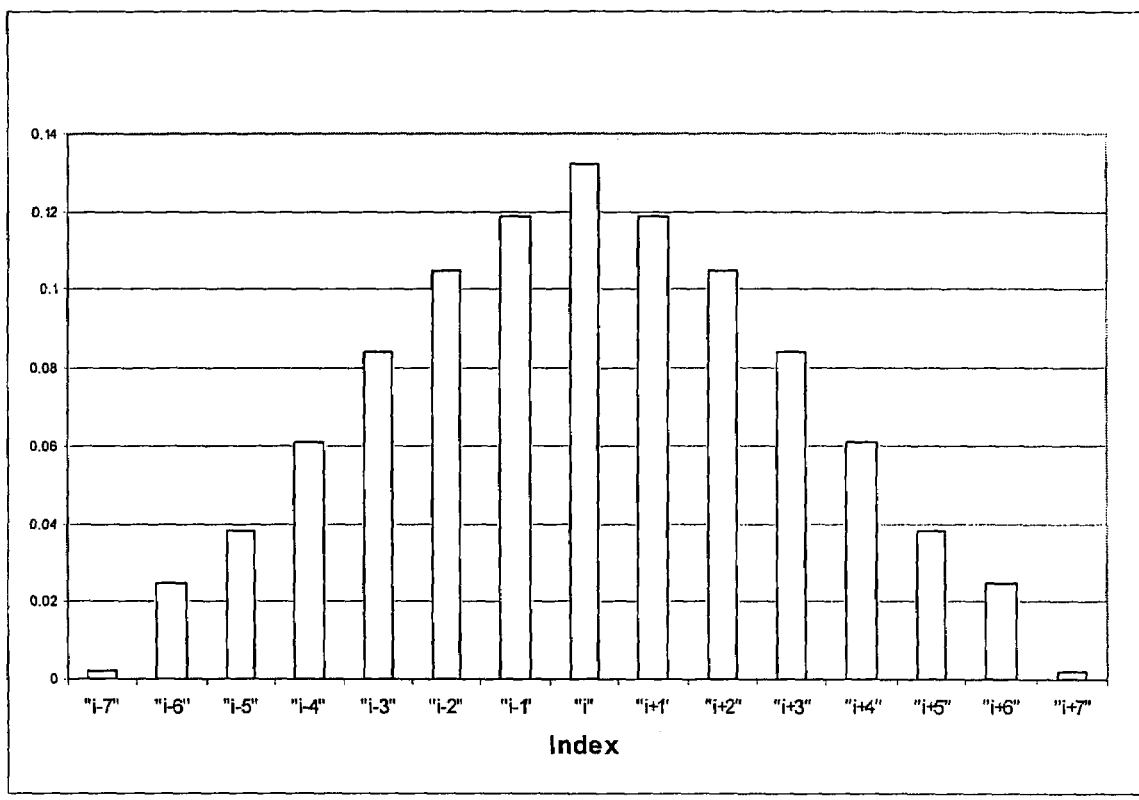
FIG. 5 illustrates a diagram of filter design coefficients that may be used in embodiments of the present invention.
Figure 6:
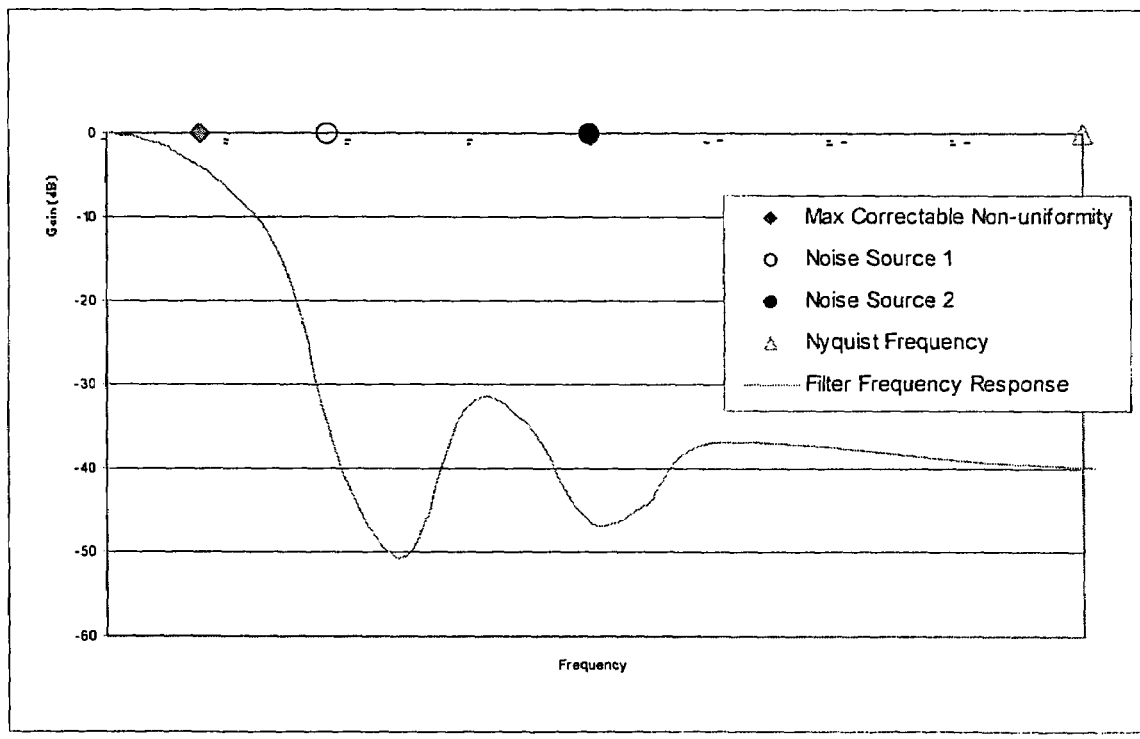
FIG. 6 illustrates the frequency response of a filter according to an embodiment of the present invention.

A known filter design package, such as one supplied by Elite Engineering of Westlake Village, Calif., may be used to determine the filter coefficients based on the pass band (1.6 Hz) and stop band (3.7 Hz) criteria determined by the controllable frequency range and observable noise sources, respectively. It is appreciated that one skilled in the art may incorporate other known filter design packages. Additional inputs for the design package include the stop band attenuation (−40 dB), ripple (0.3 dB), and sample frequency (32 Hz). The resulting distribution of coefficients is shown in FIG. 5. The frequency response of the filter is shown in FIG. 6 validating the input design criteria.

Figure 7:
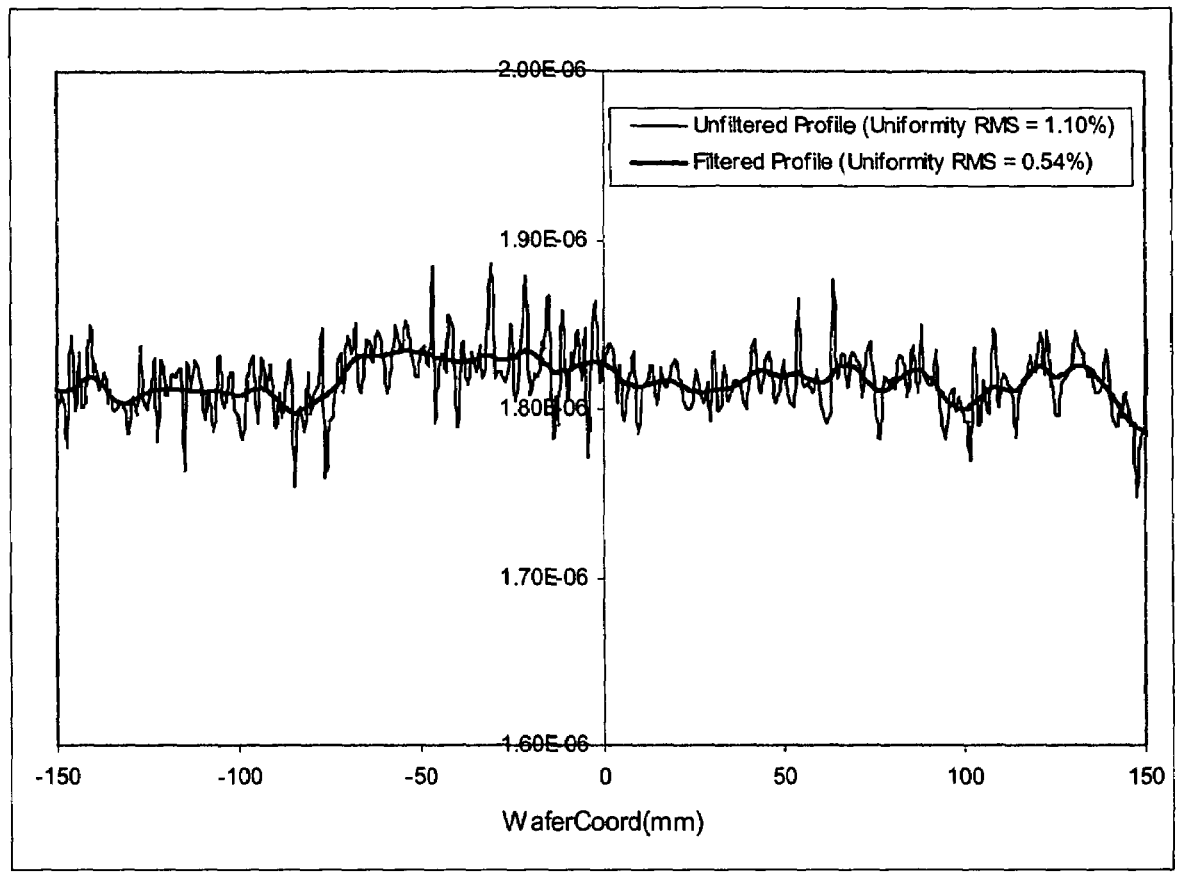
FIG. 7 illustrates the effect of a filter on an implanter uniformity profiler for an embodiment of the present invention.

An example, demonstrating the filter's effect on an actual implanter uniformity profile is shown in FIG. 7. The parameter uniformity RMS is calculated from the standard deviation (i.e.: root-mean-square or RMS) of the profile data expressed as a percentage of the average of the data for a given profile. The filtered response data shows the higher frequency noise components in the original unfiltered profile have been attenuated. The filtered signal produces a uniformity value approximately one-half as large as the unfiltered data in this specific example. Lower RMS values correspond to increased ion dose uniformity in the implanted wafer. Uniformity RMS values derived from profiles utilizing the design have been shown to correlate accurately with laboratory test data derived from the analysis of implanted wafer properties.

Unless otherwise specified, the illustrated embodiments can be understood as providing exemplary features of varying detail of certain embodiments, and therefore features, components, modules, and/or aspects of the illustrations or processes can be otherwise combined, separated, interchanged, and/or rearranged without departing from the disclosed systems or methods.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, Where such aforementioned examples are not exhaustive, and are for illustration and not limitation.

The computer program(s) is preferably implemented using one or more high level procedural or object-oriented programming languages to communicate with a computer system; however, the program(s) can be implemented in assembly or machine language, if desired. The language can be compiled or interpreted.

The processor(s) can thus be embedded in one or more devices that can be operated independently or together in a networked environment, where the network can include, for example, a Local Area Network (LAN), wide area network (WAN), and/or can include an intranet and/or the internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer(s), workstation (e.g., Sun, HP), personal digital assistant (PDA), handheld device such as cellular telephone, or another device capable of being integrated with a processor(s) that can operate as provided herein. Accordingly, the devices provided herein are not exhaustive and are provided for illustration and not limitation.

Although the methods and systems have been described relative to a specific embodiment thereof, they are not so limited. Obviously many modifications and variations may become apparent in light of the above teachings.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. An apparatus for optimizing ion implantation uniformity in a workpiece, comprising:
    an ion beam generator for generating an ion beam;
    a beam scanning mechanism for diverging said ion beam and generating substantially parallel ion beam trajectories towards the workpiece;
    an ion beam detector for measuring the ion beam current of said parallel ion beam trajectories as a function of the position of said ion beam detector; and
    a uniformity controller for filtering the ion beam current measured by said ion beam detector to at least one predetermined resolution range by filtering out noise components from at least one noise source over an attenuated frequency range from the measured ion beam current and passing through controllable feedback signal components from the measured ion beam current and generating a uniformity signal to said beam scanning mechanism in response to the filtered ion beam current so that the workpiece is uniformly implanted.

2. An apparatus according to claim 1, wherein said uniformity controller comprises a low pass filter for filtering the measured ion beam current to said at least one predetermined resolution range.

3. An apparatus according to claim 1, wherein said uniformity controller comprises a high pass filter for filtering the measured ion beam current to said at least one predetermined resolution range.

4. An apparatus according to claim 1, wherein said uniformity controller comprises a band pass filter for filtering the measured ion beam current to said at least one predetermined resolution range.

5. An apparatus according to claim 1, wherein said uniformity controller comprises a notch filter for filtering the measured ion beam current to a plurality of said at least one predetermined resolution ranges.

6. An apparatus according to claim 1, wherein said uniformity controller comprises a plurality of filters for filtering the measured ion beam current into a plurality of said at least one predetermined resolution ranges.

7. An apparatus according to claim 1, wherein said beam scanning mechanism comprises a scan generator, scan amplifiers and scan plates.

8. An apparatus according to claim 1, wherein said ion beam detector comprises a profiling Faraday detector.

9. An apparatus according to claim 8, wherein said ion beam detector further comprises a motorized mechanism for moving said profiling Faraday detector around the workpiece.

10. An apparatus according to claim 1, wherein said uniformity controller comprises a processor for iteratively measuring and processing the beam current until said predetermined range for uniformity is obtained.

11. An apparatus according to claim 1, wherein said uniformity controller generates a voltage waveform that is applied to said beam scanning mechanism.

12. An apparatus according to claim 1, wherein said workpiece is a semiconductor wafer.

13. A method for optimizing ion implantation uniformity in a workpiece, comprising the steps of:
    generating an ion beam;
    diverging and focusing said ion beam by a beam scanning mechanism to generate substantially parallel ion beam trajectories towards the workpiece;

measuring the ion beam current of said parallel ion beam trajectories with an ion beam detector as a function of the position of said ion beam detector;

filtering the ion beam current measured by said ion beam detector to at least one predetermined resolution range within a correctable system spectrum so that noise components from at least one noise source over an attenuated frequency range are filtered out from the measured ion beam current and controllable feedback signal components are passed through from the measured ion beam current; and generating a uniformity signal and inputting said uniformity signal to said beam scanning mechanism in response to the filtered ion beam current so that the workpiece is uniformly implanted.

14. A method according to claim 13, wherein said step of filtering comprises the step of filtering the measured ion beam current to a plurality of said at least one predetermined resolution ranges.

15. A method according to claim 13, wherein said step of measuring the ion beam current further comprises the step of moving said ion beam detector around the workpiece.

16. A method according to claim 13, wherein said step of generating said uniformity signal comprises the step of generating a voltage waveform and applying said voltage waveform to said beam scanning mechanism.

17. A method according to claim 13, wherein said workpiece is a semiconductor wafer.

* * * * *